US012672388B2

(12) United States Patent
Chen et al.

(10) Patent No.: US 12,672,388 B2
(45) Date of Patent: Jun. 30, 2026

(54) METHOD OF MANUFACTURING MICRO DEVICES

(71) Applicant: MIKRO MESA TECHNOLOGY CO., LTD., Apia (WS)

(72) Inventors: Li-Yi Chen, Tainan City (TW); Hsiao-Fu Lu, Tainan City (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 708 days.

(21) Appl. No.: 18/182,397

(22) Filed: Mar. 13, 2023

(65) Prior Publication Data

US 2024/0313149 A1 Sep. 19, 2024

(51) Int. Cl.
H10H 20/01 (2025.01)

(52) U.S. Cl.
CPC ....... H10H 20/0137 (2025.01); H10H 20/032 (2025.01)

(58) Field of Classification Search
CPC ...................................................... H10P 54/00
See application file for complete search history.

(56) References Cited

U.S. PATENT DOCUMENTS

| | | | | |
|---|---|---|---|---|
| 5,789,265 A | * | 8/1998 | Nitta | H10H 20/01335 |
| | | | | 438/22 |
| 12,336,326 B2 | * | 6/2025 | Chen | H10H 20/0137 |
| 2006/0099743 A1 | * | 5/2006 | Lung | G11C 13/0004 |
| | | | | 257/E27.004 |
| 2015/0187887 A1 | * | 7/2015 | Cho | H10D 62/8503 |
| | | | | 257/615 |
| 2022/0181160 A1 | * | 6/2022 | Rai | H01J 37/32449 |
| 2023/0411554 A1 | * | 12/2023 | Gandrothula | H10H 20/01335 |

* cited by examiner

*Primary Examiner* — Alexander G Ghyka
(74) *Attorney, Agent, or Firm* — CKC & Partners Co., LLC

(57) ABSTRACT

A method of manufacturing micro devices includes: preparing a III-nitride epitaxial structure including a p-type III-nitride layer, an n-type III-nitride layer on the p-type III-nitride layer, a $Al_xIII\_others_{1-x}N$ layer on the n-type III-nitride layer, and an undoped III-nitride layer on the $Al_xIII\_others_{1-x}N$ layer; forming a photoresist layer on the III-nitride epitaxial structure to contact the undoped III-nitride layer; patterning the photoresist layer; performing a first plasma etching process to the III-nitride epitaxial structure through the patterned photoresist layer to form a trench in the etched III-nitride epitaxial structure, in which the trench extends from the etched photoresist layer at least to the $Al_xIII\_others_{1-x}N$ layer; and performing a second plasma etching process to the etched III-nitride epitaxial structure until the etched III-nitride epitaxial structure is cut into a plurality of micro devices and a top surface of the etched $Al_xIII\_others_{1-x}N$ layer is exposed.

8 Claims, 8 Drawing Sheets

METHOD OF MANUFACTURING MICRO DEVICES

BACKGROUND

Field of Invention

The present disclosure relates to a method of manufacturing micro devices.

Description of Related Art

The statements in this section merely provide background information related to the present disclosure and do not necessarily constitute prior art.

As a light source, light-emitting diodes (LEDs) have many advantages, including low energy consumption, long lifetime, small size, and fast switching. Hence, conventional lighting, such as incandescent lighting, is gradually replaced by LED lights. The properties regarding LEDs also fit applications on displays. Researches on displays using micro light-emitting devices, or specifically, micro light-emitting diodes (micro LEDs), have become popular in recent years. Commercial lighting applications made of micro LEDs are nearly within reach.

During the fabrication of micro LEDs, a photoresist layer is usually used as a mask, and the photoresist layer is removed by a photoresist removal process after the micro LEDs are fabricated. The chemical substances produced in the photoresist removal process mainly include water, residual photoresist stripper, photoresist, and other substances produced after the reaction. The components of conventional photoresist strippers are usually quite complex, and most of them are composed of four to six kinds of chemical substances.

SUMMARY

According to some embodiments of the present disclosure, a method of manufacturing micro devices is provided. The method includes: preparing a III-nitride epitaxial structure comprising a p-type III-nitride layer, an n-type III-nitride layer on the p-type III-nitride layer, a $Al_xIII\_others_{1-x}N$ layer on the n-type III-nitride layer, and an undoped III-nitride layer on the $Al_xIII\_others_{1-x}N$ layer, in which x is greater than 0.05; forming a photoresist layer on the III-nitride epitaxial structure with the undoped III-nitride layer contacting the photoresist layer; patterning the photoresist layer; performing a first plasma etching process to the III-nitride epitaxial structure through the patterned photoresist layer to form a trench in the etched III-nitride epitaxial structure, in which the trench extends from the etched photoresist layer at least to the $Al_xIII\_others_{1-x}N$ layer; and performing a second plasma etching process to the etched III-nitride epitaxial structure until the etched III-nitride epitaxial structure is cut into a plurality of micro devices and a top surface of the etched $Al_xIII\_others_{1-x}N$ layer is exposed, in which a lateral length of the micro devices is smaller than about 100 μm.

According to some embodiments of the present disclosure, a method of manufacturing micro devices is provided. The method includes: preparing a III-nitride epitaxial structure comprising a p-type III-nitride layer, an n-type III-nitride layer on the p-type III-nitride layer, a $Al_xIII\_others_{1-x}N$ layer on the n-type III-nitride layer, and an undoped III-nitride layer on the $Al_xIII\_others_{1-x}N$ layer, in which x is greater than 0.05; forming a photoresist layer on the III-nitride epitaxial structure with the undoped III-nitride layer contacting the photoresist layer; patterning the photoresist layer; performing a first plasma etching process to the III-nitride epitaxial structure through the patterned photoresist layer to form a trench in the etched III-nitride epitaxial structure until the photoresist layer is entirely removed, in which the trench extends from the etched undoped III-nitride layer at least to the $Al_xIII\_others_{1-x}N$ layer; and performing a second plasma etching process to the etched III-nitride epitaxial structure until the etched III-nitride epitaxial structure is cut into a plurality of micro devices and a top surface of the etched $Al_xIII\_others_{1-x}N$ layer is exposed, in which a lateral length of the micro devices is smaller than about 100 μm.

According to some embodiments of the present disclosure, a method of manufacturing micro devices is provided. The method includes: preparing a III-nitride epitaxial structure comprising a p-type III-nitride layer, an n-type III-nitride layer on the p-type III-nitride layer, a $Al_xIII\_others_{1-x}N$ layer on the n-type III-nitride layer, and an undoped III-nitride layer on the $Al_xIII\_others_{1-x}N$ layer, in which x is greater than 0.05; forming a photoresist layer on the III-nitride epitaxial structure with the undoped III-nitride layer contacting the photoresist layer; patterning the photoresist layer; performing a first plasma etching process to the III-nitride epitaxial structure through the patterned photoresist layer to form a trench in the etched III-nitride epitaxial structure until the photoresist layer and the undoped III-nitride layer are entirely removed, in which the trench at least extends in the etched $Al_xIII\_others_{1-x}N$ layer; and performing a second plasma etching process to the etched III-nitride epitaxial structure until the etched III-nitride epitaxial structure is cut into a plurality of micro devices and a top surface of the etched $Al_xIII\_others_{1-x}N$ layer is exposed, in which a lateral length of the micro devices is smaller than about 100 μm.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
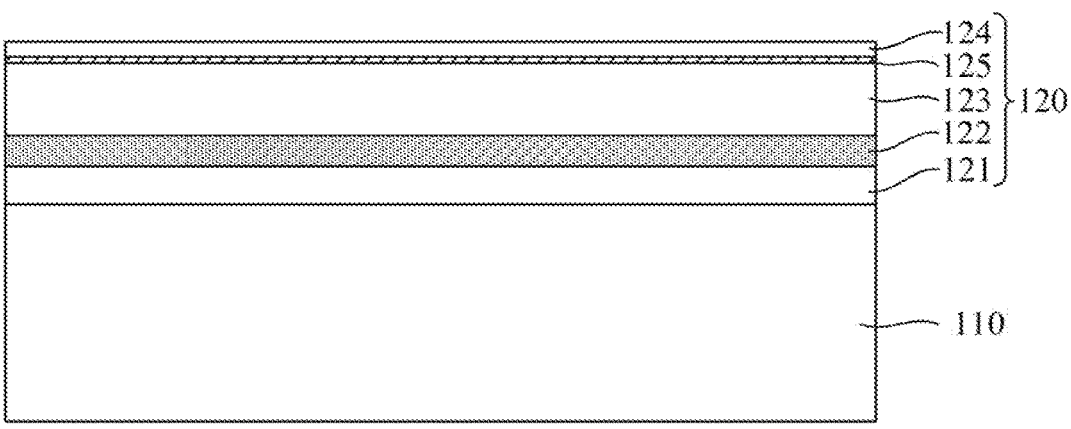
FIG. 1A is a schematic cross-sectional view of an intermediate stage of a method of manufacturing micro devices according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

The terms "micro" device, "micro" p-n diode or "micro" LED as used herein may refer to the descriptive size of certain devices or structures according to embodiments of the present disclosure. As used herein, the terms "micro" devices or structures may be meant to refer to the scale of 1 to 100 µm. However, it is to be appreciated that embodiments of the present disclosure are not necessarily so limited, and that certain aspects of the embodiments may be applicable to larger, and possibly smaller size scales.

Embodiments of the present disclosure describe a method of forming micro devices such as micro light-emitting diodes (micro LEDs) on a substrate. The substrate may be a carrier substrate or a receiving substrate. For example, the receiving substrate may be, but is not limited to, a display substrate.

Reference is made to FIG. 1A. FIG. 1A is a schematic cross-sectional view of an intermediate stage of a method of manufacturing micro devices according to some embodiments of the present disclosure. As shown in FIG. 1A, a III-nitride epitaxial structure 120 is formed on a growth substrate 110. It should be pointed out that "III" of the III-nitride epitaxial structure 120 may refer to at least one element of aluminum (Al), gallium (Ga), and indium (In). The III-nitride epitaxial structure 120 may not be fully functional. For example, contacts such as an anode or cathode may not yet be formed. In the interest of conciseness and to not obscure embodiments of the present disclosure, the following description is made with regard to the III-nitride epitaxial structure 120 as a III-nitride p-n diode layer grown on the growth substrate 110 according to conventional heterogeneous growth conditions.

In some embodiments, the growth substrate 110 may include any suitable substrate such as, but not limited to, silicon, SiC, GaAs, GaN and sapphire ($Al_2O_3$).

For example, in some embodiments, the growth substrate 110 is sapphire. Despite the fact that sapphire has a larger lattice constant and thermal expansion coefficient mismatch with respect to III-nitride, sapphire is still reasonably low cost, widely available and its transparency is compatible with laser lift-off (LLO) techniques. In some other embodiments, another material such as SiC may be used as the growth substrate 110 for the III-nitride epitaxial structure 120. Like sapphire, SiC substrates may be transparent. Several growth techniques may be used for growth of the III-nitride epitaxial structure 120 such as metalorganic chemical vapor deposition (MOCVD).

As shown in FIG. 1A, the III-nitride epitaxial structure 120 may include a p-type III-nitride layer 124, an active layer 125, an n-type III-nitride layer 123, a $Al_xIII\_others_{1-x}N$ layer 122, and an undoped III-nitride layer 121. The undoped III-nitride layer 121, the $Al_xIII\_others_{1-x}N$ layer 122, the n-type III-nitride layer 123, the active layer 125, and the p-type III-nitride layer 124 are sequentially epitaxially grown on the growth substrate 110. It should be pointed out that "Al" of the $Al_xIII\_others_{1-x}N$ layer 122 refers to aluminum. "III_others" of the $Al_xIII\_others_{1-x}N$ layer 122 may refer to either of gallium (Ga) and indium (In) or the combination of them. "N" of the $Al_xIII\_others_{1-x}N$ layer 122 refers to nitrogen. Al composition "x" of the $Al_xIII\_others_{1-x}N$ layer 122 is greater than 0.05. In some embodiments, the n-type III-nitride layer 123 may be doped with a donor such as silicon, while p-type III-nitride layer 124 may be doped with an acceptor such as magnesium. A variety of alternative p-n diode configurations may be utilized to form the III-nitride epitaxial structure 120. Likewise, a simple p-n contact junction or a variety of single quantum well (SQW) or multiple quantum well (MQW) configurations may be utilized to form the active layer 125. In addition, various buffer layers may be included as appropriate.

In some embodiments, the growth substrate 110 may have a thickness in a range from 100 µm to 400 µm. In some embodiments, the undoped III-nitride layer 121 may have a thickness in a range from 1 µm to 5 µm. In some embodiments, the n-type III-nitride layer 123 may have a thickness in a range from 0.1 µm to 5 µm. In some embodiments, the active layer 125 may have a thickness in a range from 100 nm to 400 nm. In some embodiments, the p-type III-nitride layer 124 may have a thickness in a range from 50 nm to 1 µm.

Figure 1B:
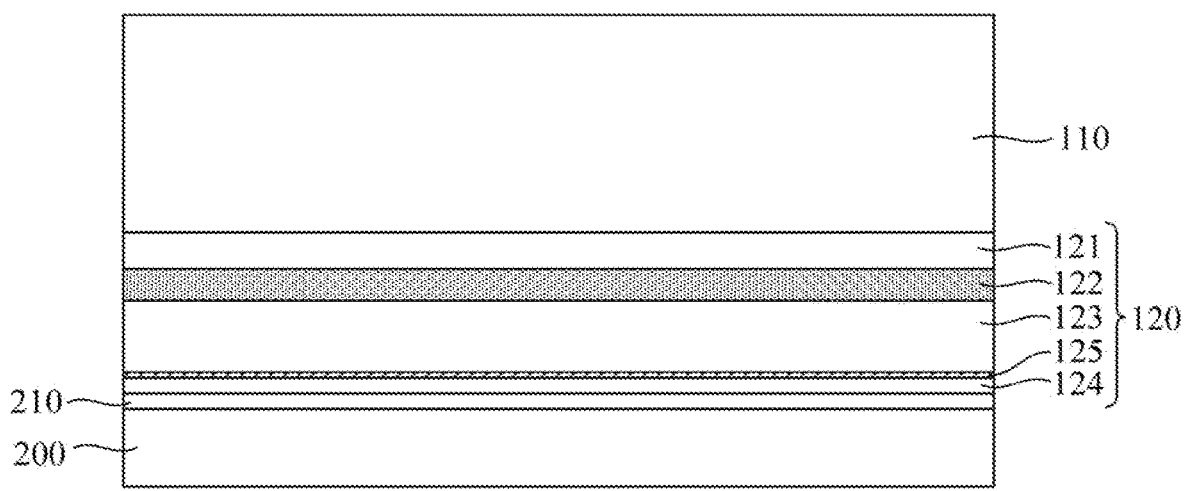
FIG. 1B is a schematic cross-sectional view of an intermediate stage of the method of manufacturing micro devices according to some embodiments of the present disclosure.

Reference is made to FIG. 1B. FIG. 1B is a schematic cross-sectional view of an intermediate stage of the method of manufacturing micro devices according to some embodiments of the present disclosure. The intermediate stage shown in FIG. 1A may be sequentially followed by the intermediate stage shown in FIG. 1B. As shown in FIG. 1B, a combination of the III-nitride epitaxial structure 120 and the growth substrate 110 is transferred to a substrate 200 with a metal layer 210 provided thereon (e.g., the substrate 200 is a receiving substrate). Specifically, after the combination of the III-nitride epitaxial structure 120 and the growth substrate 110 is transferred to the substrate 200, the III-nitride epitaxial structure 120 is placed on the metal layer 210 with the p-type III-nitride layer 124 contacting the metal layer 210.

Figure 1C:
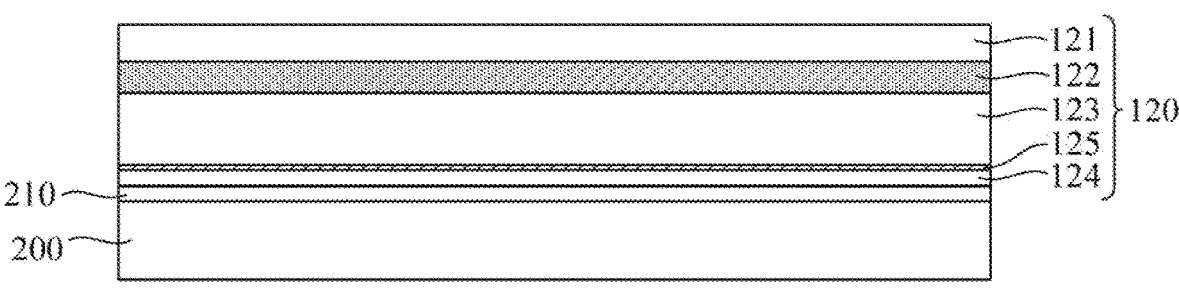
FIG. 1C is a schematic cross-sectional view of an intermediate stage of the method of manufacturing micro devices according to some embodiments of the present disclosure.

Reference is made to FIG. 1C. FIG. 1C is a schematic cross-sectional view of an intermediate stage of the method of manufacturing micro devices according to some embodiments of the present disclosure. The intermediate stage shown in FIG. 1B may be sequentially followed by the intermediate stage shown in FIG. 1C. As shown in FIG. 1C, the growth substrate 110 is removed from the III-nitride epitaxial structure 120. The growth substrate 110 may be removed by a suitable method such as chemical lift-off or laser lift-off (LLO), but the disclosure is not limited in this regard.

Figure 1D:
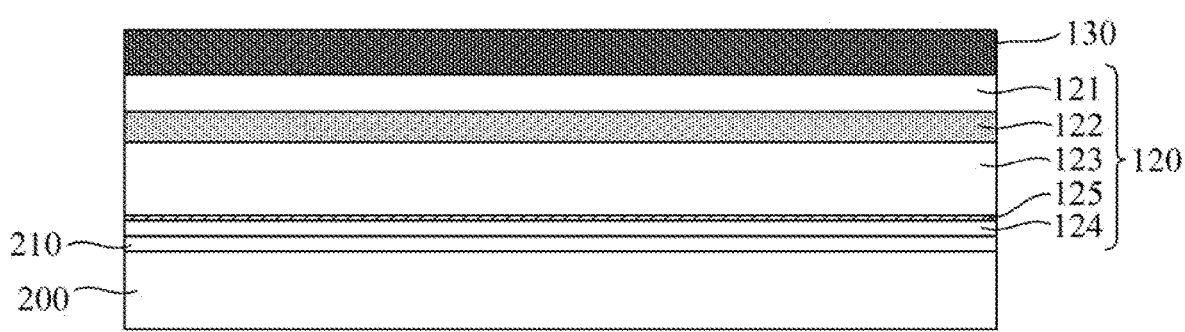
FIG. 1D is a schematic cross-sectional view of an intermediate stage of the method of manufacturing micro devices according to some embodiments of the present disclosure.

Reference is made to FIG. 1D. FIG. 1D is a schematic cross-sectional view of an intermediate stage of the method of manufacturing micro devices according to some embodiments of the present disclosure. The intermediate stage shown in FIG. 1C may be sequentially followed by the intermediate stage shown in FIG. 1D. As shown in FIG. 1D, a photoresist layer 130 is formed on the III-nitride epitaxial structure 120 with the undoped III-nitride layer 121 contacting the photoresist layer 130. In some embodiments, a thickness of the photoresist layer 130 is in a range from 1 µm to 8 µm.

Figure 1E:
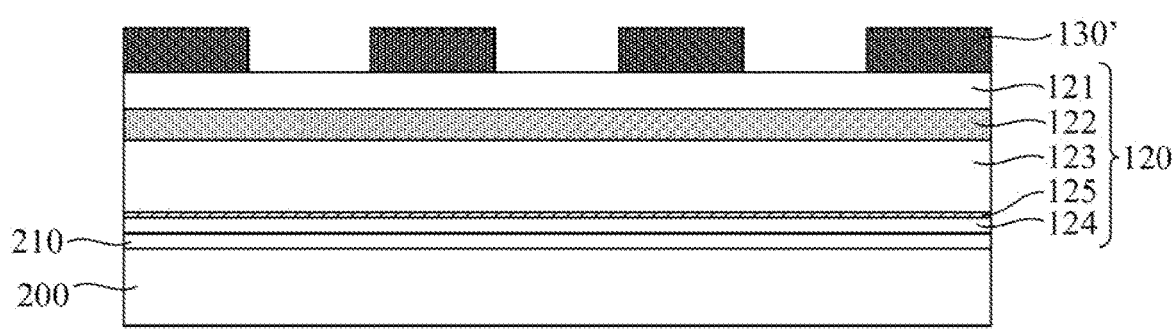
FIG. 1E is a schematic cross-sectional view of an intermediate stage of the method of manufacturing micro devices according to some embodiments of the present disclosure.

Reference is made to FIG. 1E. FIG. 1E is a schematic cross-sectional view of an intermediate stage of the method of manufacturing micro devices according to some embodiments of the present disclosure. The intermediate stage shown in FIG. 1D may be sequentially followed by the intermediate stage shown in FIG. 1E. As shown in FIG. 1E, the photoresist layer 130 is patterned. In some embodiments, the patterned photoresist layer 130' exposes some portions of the undoped III-nitride layer 121. In some other embodiments, the patterned photoresist layer 130' may be patterned to have recesses on a side of the patterned photoresist layer 130' and extending toward the III-nitride epitaxial structure 120 without reaching the undoped III-nitride layer 121.

Figure 1F:
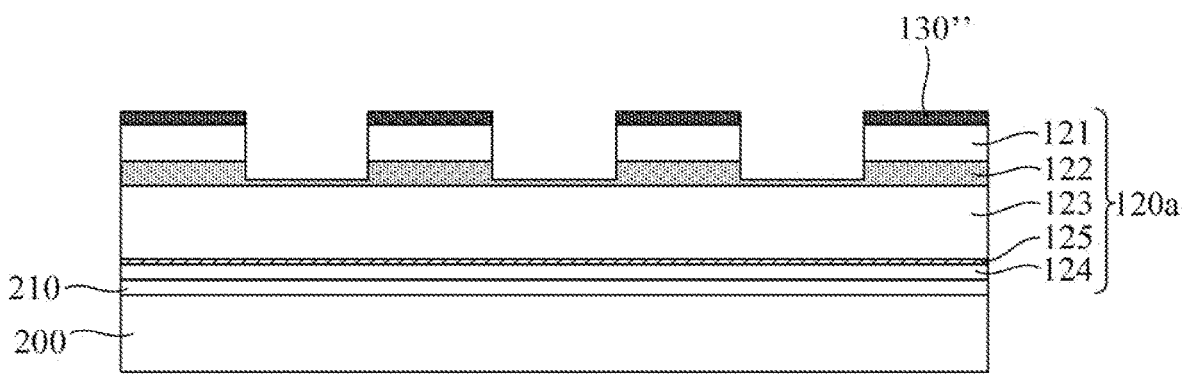
FIG. 1F is a schematic cross-sectional view of an intermediate stage of the method of manufacturing micro devices according to some embodiments of the present disclosure.

Reference is made to FIG. 1F. FIG. 1F is a schematic cross-sectional view of an intermediate stage of the method of manufacturing micro devices according to some embodiments of the present disclosure. The intermediate stage shown in FIG. 1E may be sequentially followed by the intermediate stage shown in FIG. 1F. As shown in FIG. 1F, a first plasma etching process is performed to the III-nitride epitaxial structure 120 through the patterned photoresist layer 130' to form a trench in the etched III-nitride epitaxial structure 120a, in which the trench extends from the etched photoresist layer 130" to the $Al_xIII\_others_{1-x}N$ layer 122. That is, after the first plasma etching process is finished, the etched photoresist layer 130" remains on the undoped III-nitride layer 121 and the $Al_xIII\_others_{1-x}N$ layer 122 is etched without being etched through to expose the n-type III-nitride layer 123.

Figure 1G:
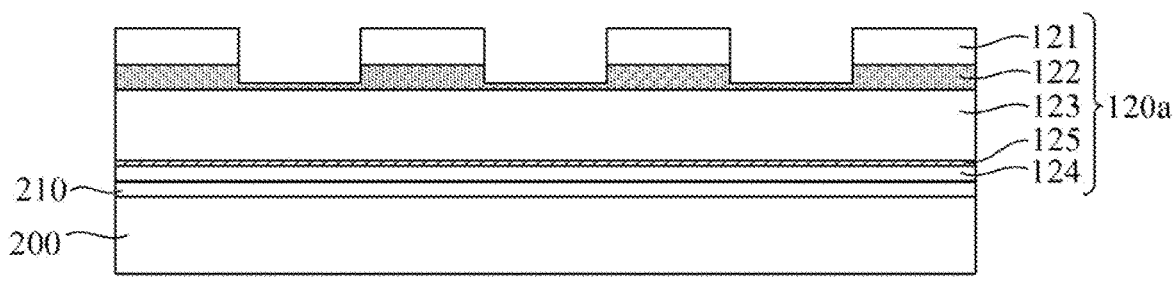
FIG. 1G is a schematic cross-sectional view of an intermediate stage of the method of manufacturing micro devices according to some embodiments of the present disclosure.

Reference is made to FIG. 1G. FIG. 1G is a schematic cross-sectional view of an intermediate stage of the method of manufacturing micro devices according to some embodiments of the present disclosure. The intermediate stage shown in FIG. 1F may be sequentially followed by the intermediate stage shown in FIG. 1G. As shown in FIG. 1G, the etched photoresist layer 130" is stripped, so that the top surface of the undoped III-nitride layer 121 is exposed.

In some embodiments, an etching gas used in the first plasma etching process may include at least one of $Cl_2$, $Br_2$, $I_2$, $CH_4$, and $BCl_3$. In some embodiments, in order to flexibly adjust the etching rate and reduce the defect, the etching gas may further include at least one of Ar and $N_2$.

Figure 1H:
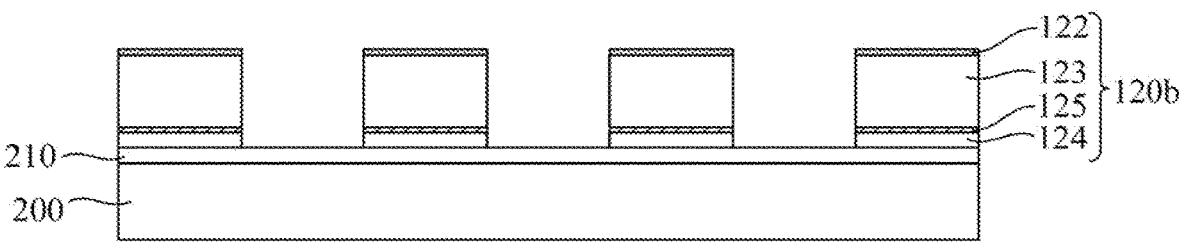
FIG. 1H is a schematic cross-sectional view of an intermediate stage of the method of manufacturing micro devices according to some embodiments of the present disclosure.

Reference is made to FIG. 1H. FIG. 1H is a schematic cross-sectional view of an intermediate stage of the method of manufacturing micro devices according to some embodiments of the present disclosure. The intermediate stage shown in FIG. 1G may be sequentially followed by the intermediate stage shown in FIG. 1H. As shown in FIG. 1H, a second plasma etching process is performed to the etched III-nitride epitaxial structure 120a until the etched III-nitride epitaxial structure 120a is cut into a plurality of micro devices 120b and a top surface of the etched $Al_xIII\_others_{1-x}N$ layer 122 is exposed, in which a lateral length of the micro devices 120b is smaller than about 100 µm. In other words, after second plasma etching process is finished, the undoped III-nitride layer 121 is completely removed and the etched III-nitride epitaxial structure 120a exposes portions of the metal layer 210.

In some embodiments, a thickness of the n-type III-nitride layer 123 is greater than a thickness of the p-type III-nitride layer 124. In this way, the n-type III-nitride layer 123 can have a sufficient thickness to increase the protection effect on the active layer 125.

In some embodiments, the $Al_xIII\_others_{1-x}N$ layer 122 is an n-doped layer, but the disclosure is not limited in this regard.

In some embodiments, the $Al_xIII\_others_{1-x}N$ layer 122 may include an n-doped area in contact with the n-type III-nitride layer 123 and an undoped area on the n-doped area. That is, the n-doped area is between the n-type III-nitride layer 123 and the undoped area. The undoped area of the $Al_xIII\_others_{1-x}N$ layer 122 is completely removed after the second plasma etching process is finished.

In some embodiments, an etching gas used in the second plasma etching process may include at least one of $Cl_2$, $SF_6$, $O_2$, $BCl_3$, $CH_4$, and $NF_3$.

In some embodiments, at least one of the first plasma etching process and the second plasma etching process includes an ICP-RIE etching process, but the disclosure is not limited in this regard.

In some embodiments, the undoped III-nitride layer 121 and the $Al_xIII\_others_{1-x}N$ layer 122 have a first etch selectivity relative to the first plasma etching process, the n-type III-nitride layer 123 and the $Al_xIII\_others_{1-x}N$ layer 122 have a second etch selectivity relative to the second plasma etching process, and the first etch selectivity is smaller than the second etch selectivity. The first etch selectivity refers to the etch depth of the undoped III-nitride layer 121 that can be exchanged for consuming a unit thickness of the $Al_xIII\_others_{1-x}N$ layer 122. The second etch selectivity refers to the etch depth of the n-type III-nitride layer 123 that can be exchanged for consuming a unit thickness of the $Al_xIII\_others_{1-x}N$ layer 122.

It should be pointed out that the $Al_xIII\_others_{1-x}N$ layer 122 of the III-nitride epitaxial structure 120 is etched at slower etch rates in the first and second plasma etching processes, so the $Al_xIII\_others_{1-x}N$ layer 122 is the most important contributor to the effect of amplifying the trenches among the micro devices 120b. In this way, the thickness of the photoresist layer 130 can be effectively reduced, and the problem that the etch selectivity between the photoresist layer 130 and the III-nitride epitaxial structure 120 is less than 1.0 can be solved. For example, the thickness of the photoresist layer 130 may be smaller than 6 μm. In addition, since the $Al_xIII\_others_{1-x}N$ layer 122 is etched at a slower etch rate in the second plasma etching process and remains on the n-type III-nitride layer 123 after the second plasma etching process is finished, heights of micro devices 120b relative to the substrate 200 can be relatively average. In some embodiments, the second etch selectivity is greater than 1.30, but the present disclosure is not limited in this regard.

In some embodiments, the etch selectivity may be changed by flexibly adjusting at least one of the radio frequency (RF) power of the ICP-RIE etching process, the DC bias, types of etching gases, or a mix ratio of $Cl_2$ and $BCl_3$.

Figure 1I:
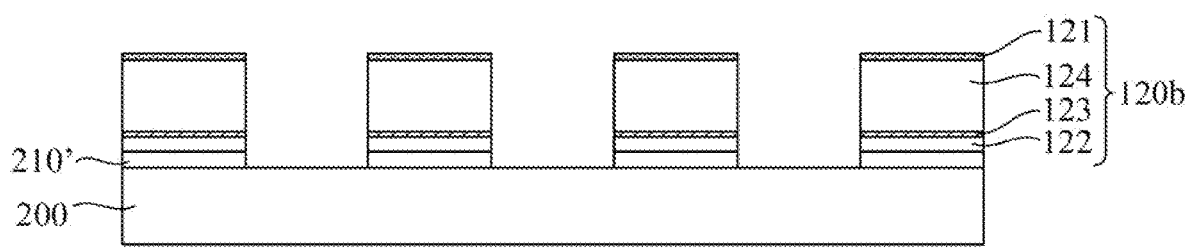
FIG. 1I is a schematic cross-sectional view of an intermediate stage of the method of manufacturing micro devices according to some embodiments of the present disclosure.

Reference is made to FIG. 1I. FIG. 1I is a schematic cross-sectional view of an intermediate stage of the method of manufacturing micro devices according to some embodiments of the present disclosure. The intermediate stage shown in FIG. 1H may be sequentially followed by the intermediate stage shown in FIG. 1I. As shown in FIG. 1I, the metal layer 210 is etched into a plurality of metal pads 210' respectively under the micro devices 120b.

In some embodiments, a thickness of the metal layer 210 is smaller than 1 μm. In this way, the metal pads 210' formed from the metal layer 210 can be prevented from being polluted too much by etching.

Figure 2A:
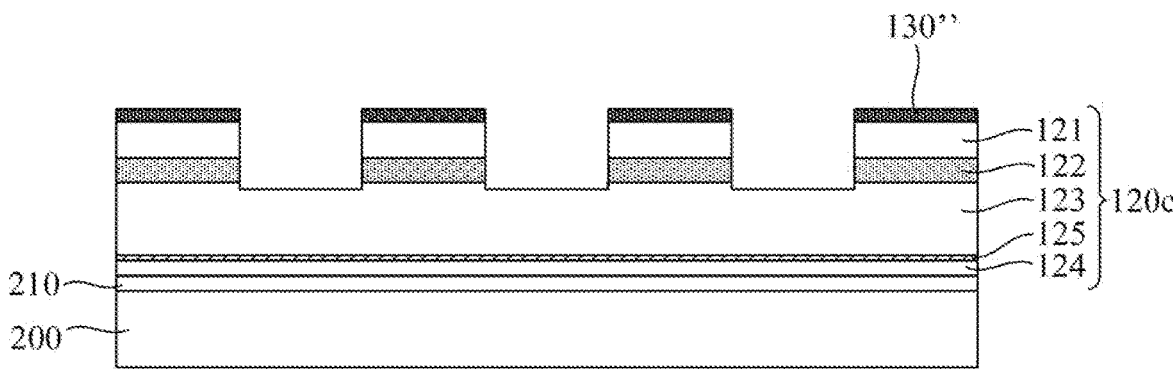
FIG. 2A is a schematic cross-sectional view of an intermediate stage of a method of manufacturing micro devices according to some embodiments of the present disclosure.
Figure 2B:
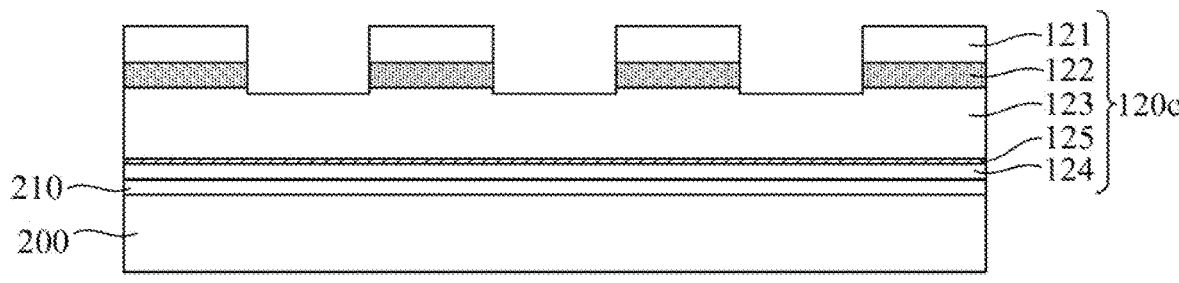
FIG. 2B is a schematic cross-sectional view of an intermediate stage of the method of manufacturing micro devices according to some embodiments of the present disclosure.

Reference is made to FIGS. 2A and 2B. FIGS. 2A and 2B are schematic cross-sectional views of intermediate stages of the method of manufacturing micro devices according to some embodiments of the present disclosure. In some embodiments, the intermediate stages shown in FIGS. 1F and 1G may be respectively replaced by the intermediate stages shown in FIGS. 2A and 2B. As shown in FIG. 2A, the first plasma etching process is performed to the III-nitride epitaxial structure 120 as shown in FIG. 1E through the patterned photoresist layer 130' to form a trench in the etched III-nitride epitaxial structure 120c, in which the trench extends from the etched photoresist layer 130" to the n-type III-nitride layer 123. That is, after the first plasma etching process is finished, the etched photoresist layer 130" remains on the undoped III-nitride layer 121 and the $Al_xIII\_others_{1-x}N$ layer 122 is etched through to expose the n-type III-nitride layer 123. As shown in FIG. 2B, the etched photoresist layer 130" is stripped, so that the top surface of the undoped III-nitride layer 121 is exposed.

In some embodiment, the intermediate stages shown in FIGS. 1F and 1G may be replaced by the intermediate stage shown in FIG. 2B only. That is, the first plasma etching process is performed to the III-nitride epitaxial structure 120 as shown in FIG. 1E through the patterned photoresist layer 130' to form a trench in the etched III-nitride epitaxial structure 120c until the patterned photoresist layer 130' is entirely removed, in which the trench extends from the etched undoped III-nitride layer 121 to the n-type III-nitride layer 123. In this regard, the step of stripping the etched photoresist layer 130" (referring to FIG. 2A) is no more required.

Similarly, in some embodiments, the intermediate stage shown in FIG. 1E may be directly followed by the intermediate stage shown in FIG. 1G. That is, the first plasma etching process is performed to the III-nitride epitaxial structure 120 through the patterned photoresist layer 130' to form a trench in the etched III-nitride epitaxial structure 120a until the patterned photoresist layer 130' is entirely removed, in which the trench extends from the etched undoped III-nitride layer 121 to the $Al_xIII\_others_{1-x}N$ layer 122. In this regard, the step of stripping the etched photoresist layer 130" (referring to FIG. 1F) is no more required.

Figure 3:
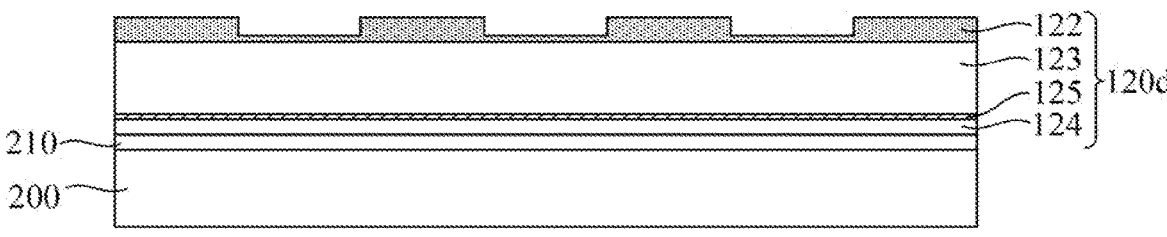
FIG. 3 is a schematic cross-sectional view of an intermediate stage of a method of manufacturing micro devices according to some embodiments of the present disclosure.

Reference is made to FIG. 3. FIG. 3 is a schematic cross-sectional view of an intermediate stage of the method of manufacturing micro devices according to some embodiments of the present disclosure. In some embodiments, the intermediate stages shown in FIGS. 1F and 1G may be replaced by the intermediate stage shown in FIG. 3 only. As shown in FIG. 3, the first plasma etching process is performed to the III-nitride epitaxial structure 120 as shown in FIG. 1E through the patterned photoresist layer 130' to form a trench in the etched III-nitride epitaxial structure 120d until the patterned photoresist layer 130' and the undoped III-nitride layer 121 are entirely removed, in which the trench extends in the etched $Al_xIII\_others_{1-x}N$ layer 122. In this regard, the step of stripping the etched photoresist layer 130" (referring to FIG. 1F) is no more required.

Figure 4:
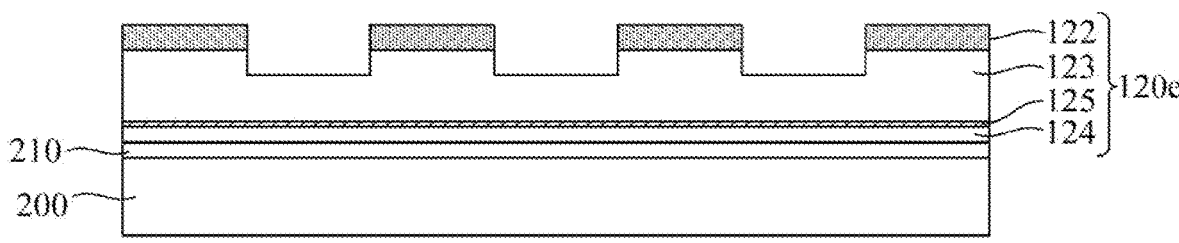
FIG. 4 is a schematic cross-sectional view of an intermediate stage of the method of manufacturing micro devices according to some embodiments of the present disclosure.

Reference is made to FIG. 4. FIG. 4 is a schematic cross-sectional view of an intermediate stage of the method of manufacturing micro devices according to some embodiments of the present disclosure. In some embodiments, the intermediate stages shown in FIGS. 1F and 1G may be replaced by the intermediate stage shown in FIG. 4 only. As shown in FIG. 4, the first plasma etching process is performed to the III-nitride epitaxial structure 120 as shown in FIG. 1E through the patterned photoresist layer 130' to form a trench in the etched III-nitride epitaxial structure 120e until the patterned photoresist layer 130' and the undoped III-nitride layer 121 are entirely removed, in which the trench extends from the etched $Al_xIII\_others_{1-x}N$ layer 122 to the n-type III-nitride layer 123. In this regard, the step of stripping the etched photoresist layer 130" (referring to FIG. 1F) is no more required.

Figure 5A:
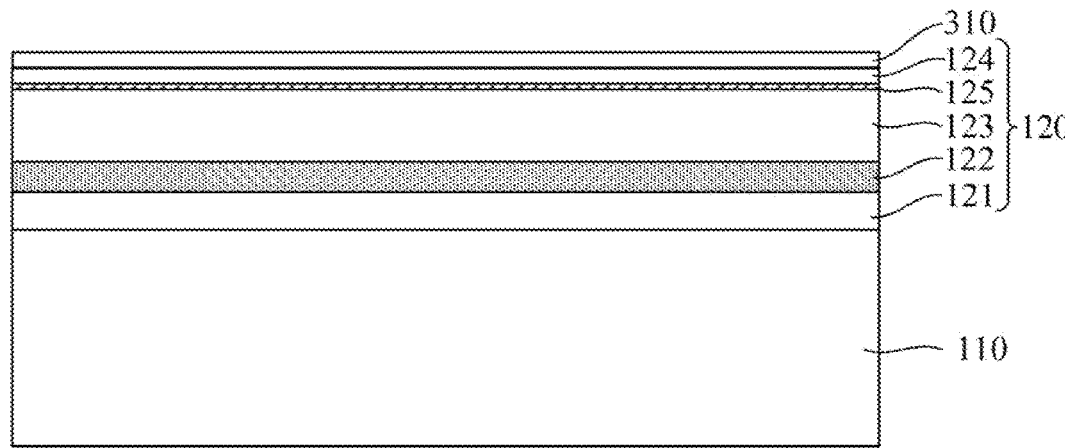
FIG. 5A is a schematic cross-sectional view of an intermediate stage of the method of manufacturing micro devices according to some embodiments of the present disclosure.

Reference is made to FIG. 5A. FIG. 5A is a schematic cross-sectional view of an intermediate stage of the method of manufacturing micro devices according to some embodiments of the present disclosure. In some embodiments, the intermediate stage shown in FIG. 1A may be directly followed by the intermediate stage shown in FIG. 5A. As shown in FIG. 5A, a metal layer 310 is formed on the III-nitride epitaxial structure 120 with the metal layer 310 contacting the p-type III-nitride layer 124.

Figure 5B:
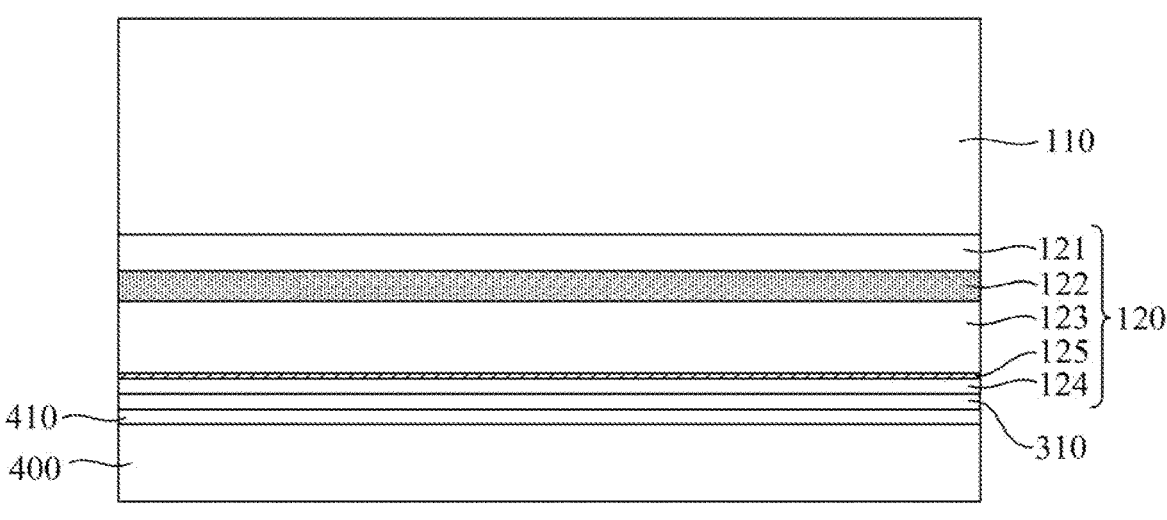
FIG. 5B is a schematic cross-sectional view of an intermediate stage of the method of manufacturing micro devices according to some embodiments of the present disclosure.

Reference is made to FIG. 5B. FIG. 5B is a schematic cross-sectional view of an intermediate stage of the method of manufacturing micro devices according to some embodiments of the present disclosure. In some embodiments, the intermediate stage shown in FIG. 5A may be directly followed by the intermediate stage shown in FIG. 5B. As shown in FIG. 5B, a combination of the metal layer 310, the III-nitride epitaxial structure 120, and the growth substrate 110 is transferred to a substrate 400 with an adhesive layer 410 provided thereon (i.e., the substrate 400 is a carrier substrate), such that the metal layer 310 is in contact with the adhesive layer 410.

Figure 5C:
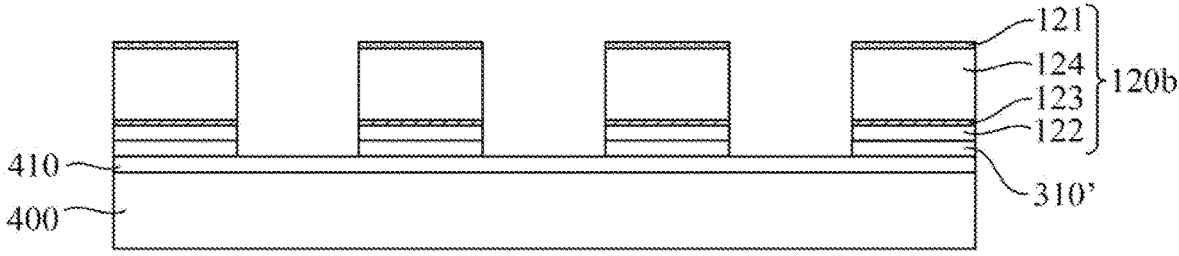
FIG. 5C is a schematic cross-sectional view of an intermediate stage of the method of manufacturing micro devices according to some embodiments of the present disclosure.

Reference is made to FIG. 5C. FIG. 5C is a schematic cross-sectional view of an intermediate stage of the method of manufacturing micro devices according to some embodiments of the present disclosure. In some embodiments, the intermediate stage shown in FIG. 5B may be sequentially followed by intermediate stages similar to those shown in FIGS. 1C, 1D, 1E, 1F, 1G, 1H, and 1I respectively, such that the intermediate stage shown in FIG. 5C can be obtained. As shown in FIG. 5C, the metal layer 310 is etched into a plurality of metal pads 310' respectively under the micro devices 120b. It should be pointed out that the micro devices 120b with the metal pads 310' attached thereto may be then massively transferred from the substrate 400 to another substrate (e.g., a receiving substrate).

According to the foregoing recitations of the embodiments of the disclosure, it can be seen that in the method of manufacturing micro devices of the present disclosure, the $Al_xIII\_others_{1-x}N$ layer of the III-nitride epitaxial structure is the most important contributor to the effect of amplifying the trenches among the micro devices, so the thickness of the photoresist layer can be effectively reduced. In this way, the problem that the etch selectivity between the photoresist layer and the III-nitride epitaxial structure is less than 1.0 can be solved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing micro devices, comprising:
preparing a III-nitride epitaxial structure comprising a p-type III-nitride layer, an n-type III-nitride layer on the p-type III-nitride layer, a $Al_xIII\_others_{1-x}N$ layer on the n-type III-nitride layer, and an undoped III-nitride layer on the $Al_xIII\_others_{1-x}N$ layer, wherein x is greater than 0.05;

forming a photoresist layer on the III-nitride epitaxial structure with the undoped III-nitride layer contacting the photoresist layer;
patterning the photoresist layer;
performing a first plasma etching process to the III-nitride epitaxial structure through the patterned photoresist layer to form a trench in the etched III-nitride epitaxial structure, wherein the trench extends from the etched photoresist layer at least to the $Al_xIII\_others_{1-x}N$ layer; and
performing a second plasma etching process to the etched III-nitride epitaxial structure until the etched III-nitride epitaxial structure is cut into a plurality of micro devices and a top surface of the etched $Al_xIII\_others_{1-x}N$ layer is exposed, wherein a lateral length of the micro devices is smaller than about 100 μm.

2. The method of claim 1, wherein the performing the first plasma etching process extends the trench from the etched photoresist layer to the n-type III-nitride layer.

3. The method of claim 1, further comprising stripping the etched photoresist layer after the performing the first plasma etching process and before the performing the second plasma etching process.

4. The method of claim 1, wherein the $Al_xIII\_others_{1-x}N$ layer is an n-doped layer.

5. The method of claim 1, wherein the $Al_xIII\_others_{1-x}N$ layer comprises an n-doped area in contact with the n-type III-nitride layer.

6. The method of claim 1, wherein the undoped III-nitride layer and the $Al_xIII\_others_{1-x}N$ layer have a first etch selectivity relative to the first plasma etching process, the n-type III-nitride layer and the $Al_xIII\_others_{1-x}N$ layer have a second etch selectivity relative to the second plasma etching process, and the first etch selectivity is smaller than the second etch selectivity.

7. The method of claim 1, further comprising:
placing the III-nitride epitaxial structure on a metal layer with the p-type III-nitride layer contacting the metal layer before the forming the photoresist layer, wherein the performing the second plasma etching process exposes portions of the metal layer.

8. The method of claim 7, further comprising:
etching the metal layer into a plurality of metal pads respectively under the micro devices.

* * * * *